US007079542B2

(12) United States Patent
Park et al.

(10) Patent No.: US 7,079,542 B2
(45) Date of Patent: Jul. 18, 2006

(54) INTERNET PROTOCOL ADDRESS LOOK-UP METHOD

(75) Inventors: Young-Keun Park, Koyang-shi (KR); Kang-Young Moon, Yongin-shi (KR); Byung-Chang Kang, Yongin-shi (KR); Byung-Gu Choe, Seoul (KR)

(73) Assignees: Samsung Electronics Co., Ltd., Gyeonggi-do (KR); Yonsei University, Seoul (KR)

( * ) Notice: Subject to any disclaimer, the term of this patent is extended or adjusted under 35 U.S.C. 154(b) by 367 days.

(21) Appl. No.: 10/462,739

(22) Filed: Jun. 17, 2003

(65) Prior Publication Data
US 2004/0006668 A1    Jan. 8, 2004

(30) Foreign Application Priority Data
Jul. 2, 2002   (KR)   ................... 10-2002-0037912
Jul. 2, 2002   (KR)   ................... 2002-37911

(51) Int. Cl.
*H04L 12/28* (2006.01)
(52) U.S. Cl. ............... 370/395.52; 370/392; 370/466; 370/469; 711/108; 707/3; 713/759
(58) Field of Classification Search ............... 711/108; 707/3; 708/200; 370/392
See application file for complete search history.

(56) References Cited
U.S. PATENT DOCUMENTS

| 5,920,886 | A | * | 7/1999 | Feldmeier ............... 711/108 |
| 6,052,683 | A | | 4/2000 | Irwin |
| 6,061,712 | A | | 5/2000 | Tzeng |
| 6,081,440 | A | | 6/2000 | Washburn et al. |
| 6,237,061 | B1 | | 5/2001 | Srinivasan et al. |
| 6,252,872 | B1 | | 6/2001 | Tzeng |
| 6,288,922 | B1 | | 9/2001 | Wong et al. |
| 6,289,414 | B1 | | 9/2001 | Feldmeier et al. |
| 6,307,855 | B1 | * | 10/2001 | Hariguchi ............... 370/392 |
| 6,370,145 | B1 | | 4/2002 | Dally et al. |
| 6,374,326 | B1 | | 4/2002 | Kansal et al. |

(Continued)

OTHER PUBLICATIONS

Request for Comments (RFC) 1517 entitled *Applicability Statement for the Implementation of Classless Inter-Domain Routing (CIDR)* and dated Sep. 1993 (http://www.rfc-editor.org).

(Continued)

*Primary Examiner*—Mano Padmanabhan
*Assistant Examiner*—Mardochee Chery
(74) *Attorney, Agent, or Firm*—Robert E. Bushnell, Esq.

(57) ABSTRACT

An Internet Protocol address look-up method for looking up an Internet Protocol address of an Internet Protocol packet in order to forward the Internet Protocol packet uses a ternary content addressable memory (CAM) which has routing entries, each including a pair of data strings having a prefix of an Internet Protocol address and a mask string representing a length of the prefix, which compares a search key as a destination address of the Internet Protocol packet to be forwarded with the routing entries, which sets a match line of a matching routing entry, and which outputs a mask string of the matching routing entry. The method comprises the steps of: comparing prefix lengths of mask strings outputted in correspondence to set match lines when at least one match line is set in the ternary content addressable memory (CAM); and determining, as a longest prefix matching (LPM) entry, a routing entry corresponding to a mask string having the longest prefix length.

21 Claims, 11 Drawing Sheets

U.S. PATENT DOCUMENTS

| | | |
|---|---|---|
| 6,401,130 B1 | 6/2002 | Cain |
| 6,418,042 B1 | 7/2002 | Srinivasan et al. |
| 6,738,792 B1 * | 5/2004 | Muthusamy ................ 708/200 |
| 2004/0006668 A1 | 1/2004 | Park et al. |

OTHER PUBLICATIONS

Request for Comments (RFC) 1518 entitled *An Architecture for IP Address Allocation with CIDR* and dated Sep. 1993 (http://www.rfc-editor.org).

Request for Comments (RFC) 1519 entitled *Classless Inter-Domain Routing (CIDR): an Address Assignment and Aggregation Strategy* and dated Sep. 1993 (http://www.rfc-editor.org).

Request for Comments (RFC) 1520 entitled *Exchanging Routing Information Across Provider Boundaries in the CIDR Environment* and dated Sep. 1993 (http://www.rfc-editor.org).

Publication entitled *A Longest Prefix Match Search Engine for Multi-gigabit IP Processing* by Kobayashi, M., Murase, T., and Kuriyama, A., in IEEE International Conference on Communications, vol. 3, Jun. 2000, pp. 1360-1364.

* cited by examiner

INTERNET PROTOCOL ADDRESS LOOK-UP METHOD

CROSS REFERENCE TO RELATED APPLICATIONS

This application relates to a U.S. patent application which is being concurrently filed in the U.S. Patent & Trademrak Office, which is based on the Korean patent application entitled INTERNET PROTOCOL ADDRESS LOOK-UP DEVICE earlier filed in the Korean Industrial Property Office on 2 Jul. 2002 and there duly assigned Serial No. 2002-37912, and Korean patent application entitled INTERNET PROTOCOL ADDRESS LOOK-UP METHOD earlier filed in the Korean Industrial Property Office on 2 Jul. 2002 and there duly assigned Serial No. 2002-37911.

CLAIM OF PRIORITY

This application makes reference to, incorporates the same herein, and claims all benefits accruing under 35 U.S.C. § 119 from an application entitled INTERNET PROTOCOL ADDRESS LOOK-UP METHOD filed in the Korean Industrial Property Office on 2 Jul. 2002 and assigned Serial No. 2002-37911, and claims all benefits accruing under 35 U.S.C. § 119 from an application entitled INTERNET PROTOCOL ADDRESS LOOK-UP DEVICE earlier filed in the Korean Industrial Property Office on 2 Jul. 2002 and there duly assigned Serial No. 2002-37912.

BACKGROUND OF THE INVENTION

1. Technical Field

The present invention relates to an Internet Protocol (IP) addressing technique, and more particularly, to a method for looking up an Internet Protocol address using a ternary content addressable memory (CAM).

2. Related Art

Today the Internet is being used by more and more people, and there is an increase in network traffic such as multimedia that requires a broadband connection. In view of these factors, efforts can be taken to attempt to maintain or improve the quality of Internet service.

It would be desirable to improve the efficiency and speed of the process of looking up Internet Protocol addresses. Earlier Internet Protocol address look-up methods can lead to undesirable delays.

Exemplars in the art include Request for Comments (RFC) 1517 entitled *Applicability Statement for the Implementation of Classless Inter-Domain Routing (CIDR)* and dated September 1993, Request for Comments (RFC) 1518 entitled *An Architecture for IP Address Allocation with CIDR* and dated September 1993, Request for Comments (RFC) 1519 entitled *Classless Inter-Domain Routing (CIDR): an Address Assignment and Aggregation Strategy* and dated September 1993, Request for Comments (RFC) 1520 entitled *Exchanging Routing Information Across Provider Boundaries in the CIDR Environment* and dated September 1993, a publication entitled *A Longest Prefix Match Search Engine for Multi-gigabit IP Processing* by Kobayashi, M., Murase, T., and Kuriyama, A., in IEEE International Conference on Communications, vol. 3, June 2000, pp. 1360–1364, U.S. Pat. No. 5,920,886 issued to Feldmeier on 6 Jul. 1999 for Accelerated Hierarchical Address Filtering and Translation Using Binary and Ternary CAMS, U.S. Pat. No. 6,081,440 issued to Washburn et al. on 27 Jun. 2000 for Ternary Content Addressable Memory (CAM) Having Fast Insertion and Deletion of Data Values, U.S. Pat. No. 6,237,061 issued to Srinivasan et al. on 22 May 2001 for Method for Longest Prefix Matching in a Content Addressable Memory, U.S. Pat. No. 6,252,872 issued to Tzeng on 26 Jun. 2001 for Data Packet Filter Using Contents Addressable Memory (CAM) and Method, U.S. Pat. No. 6,288,922 issued to Wong et al. on 11 Sep. 2001 for Structure and Method of an Encoded Ternary Content Addressable Memory (CAM) Cell for Low-power Compare Operation, U.S. Pat. No. 6,370,145 issued to Dally et al. on 9 Apr. 2002 for Internet Switch Router, U.S. Pat. No. 6,418,042 issued to Srinivasan et al. on 9 Jul. 2002 for Ternary Content Addressable Memory with Compare Operand Selected According to Mask Value, U.S. Pat. No. 6,401,130 issued to Cain for Auto Aggregation Method for IP Prefix/Length Pairs, U.S. Pat. No. 6,374,326 issued to Kansal et al. for Multiple Bank Cam Architecture and Method for Performing Concurrent Lookup Operations, U.S. Pat. No. 6,052,683 issued to Irwin for Address Lookup in Packet Data Networks, U.S. Pat. No. 6,061,712 issued to Tzeng for Method for IP Routing Table Lookup, U.S. Pat. No. 6,289,414 to Feldmeier et al., entitled PARTIALLY ORDERED CAMS USED IN TERNARY HIERARCHICAL ADDRESS SEARCHING/SORTING, issued on Sep. 11, 2001, and U.S. Pat. No. 6,307,855 to Hariguchi, entitled NETWORK ROUTING TABLE USING CONTENT ADDRESSABLE MEMORY, issued on Oct. 23, 2001.

While these recent efforts provide advantages, they fail to adequately provide an improved method for efficiently and conveniently looking up Internet Protocol addresses.

SUMMARY OF THE INVENTION

Therefore, the present invention has been developed in view of the above problems, and it is an object of the present invention to provide an Internet Protocol address look-up method which can look up an Internet Protocol address without requiring prefixes of a routing table to be arranged in order of length or executing a feedback search.

Another object of the present invention is to provide an Internet Protocol address look-up method which allows a routing table to be quickly updated and which is capable of looking up an Internet Protocol address using an ordinary ternary content addressable memory (CAM).

In accordance with the present invention, the above and other objects can be accomplished by the provision of an Internet Protocol address look-up method comprising the steps of: comparing prefix lengths of mask strings outputted in correspondence to set match lines when at least one match line is set in a ternary content addressable memory (CAM); and determining, as a longest prefix matching (LPM) entry, a routing entry corresponding to a mask string having a longest prefix length.

To achieve these and other objects in accordance with the principles of the present invention, as embodied and broadly described, the present invention provides an Internet Protocol address look-up method, the method comprising: inputting a search key into a plurality of routing entries, each one of the respective routing entries having a data string that includes data of a respective prefix and having a mask string that includes length of the respective prefix, each one of the routing entries being included in a ternary content addressable memory (CAM); detecting matching prefixes when the search key matches prefixes from among the prefixes of the routing entries; outputting the mask strings corresponding to the routing entries having the matching prefixes; and comparing lengths of the matching prefixes corresponding to the outputted mask strings to determine a longest prefix matching (LPM) entry, the longest prefix matching entry corresponding to the routing entry having the longest outputted mask string.

To achieve these and other objects in accordance with the principles of the present invention, as embodied and broadly described, the present invention provides an Internet Protocol address look-up method for looking up an Internet Protocol address of an Internet Protocol packet in order to forward the Internet Protocol packet, the method comprising: inputting a search key into a plurality of routing entries, the search key corresponding to a destination address of an Internet Protocol packet to be forwarded, each one of the respective routing entries having a data string that includes a respective prefix and having a mask string that represents length of the respective prefix, each one of the routing entries being included in a ternary content addressable memory (CAM); detecting matching prefixes when the search key matches prefixes from among the prefixes of the routing entries; outputting the mask strings corresponding to the routing entries having the matching prefixes; assigning an upper pointer to a most significant bit of the outputted mask strings; assigning a lower pointer to a least significant bit of the outputted mask strings; assigning a check pointer to a bit of the outputted mask strings intermediately positioned between the upper and lower pointers; when more than one bit indicated by the check pointer corresponds to a prefix bit, reassigning the lower pointer to a new position corresponding to the position of the check pointer and then reassigning the check pointer to a bit of the outputted mask strings intermediately positioned between the upper pointer and the reassigned lower pointer; and when only one bit indicated by the check pointer corresponds to a prefix bit, determining that a longest prefix matching (LPM) entry corresponds to the outputted mask string having the one bit indicated by the check pointer, the longest prefix matching entry corresponding to the routing entry having the longest outputted mask string.

To achieve these and other objects in accordance with the principles of the present invention, as embodied and broadly described, the present invention provides a method, comprising: receiving a search key at a memory having a plurality of routing entries, each one of the respective routing entries having a data string that includes data of a respective prefix and having a mask string that includes a length of the respective prefix; detecting matching prefixes when the search key matches prefixes from among the prefixes of the routing entries; outputting the mask strings corresponding to the routing entries having the matching prefixes; and comparing lengths of the matching prefixes corresponding to the outputted mask strings to determine a longest prefix matching entry, the longest prefix matching entry corresponding to the routing entry having the longest outputted mask string.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF THE PREFERRED EMBODIMENTS

Figure 1:
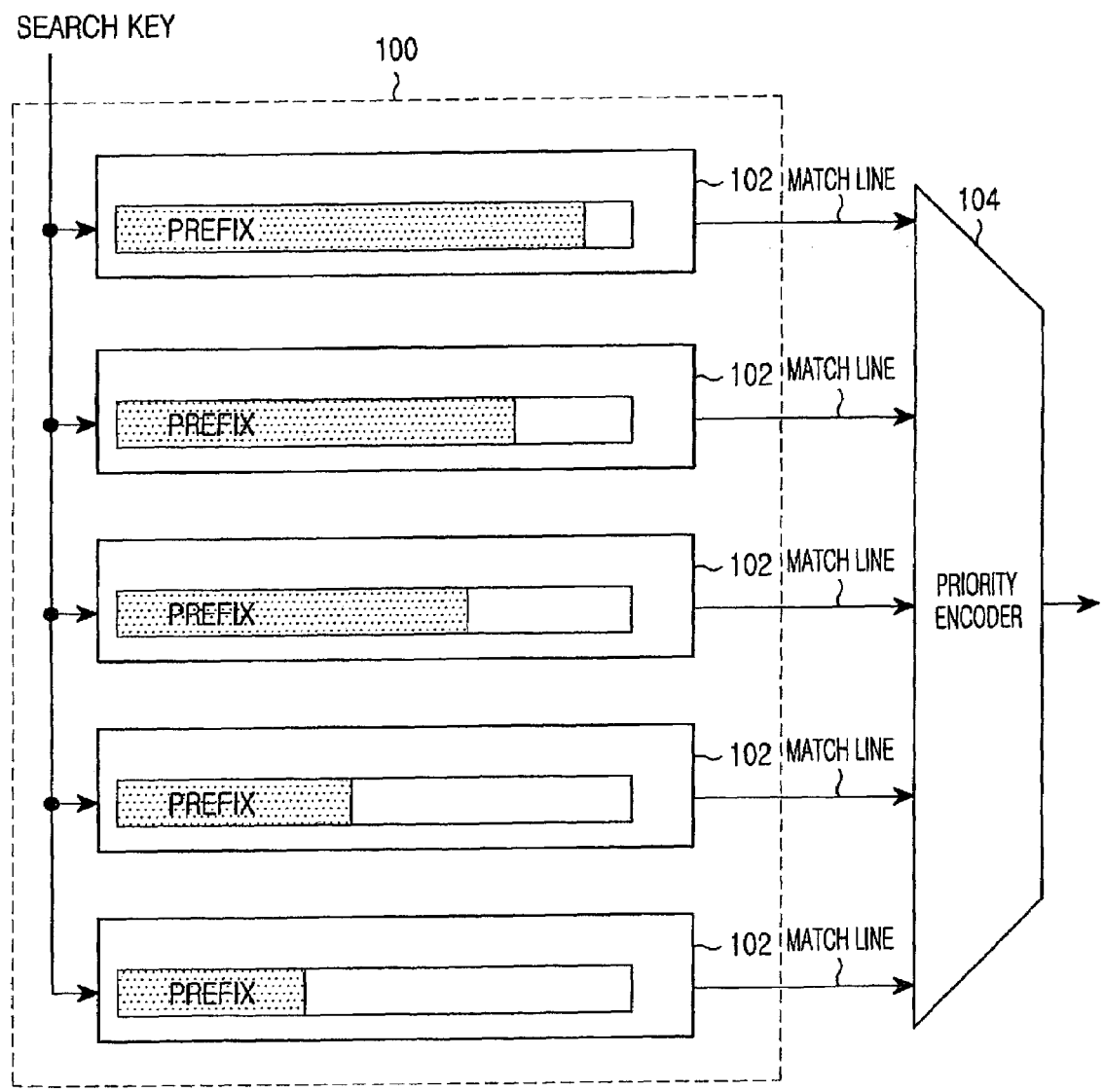
FIG. 1 is a schematic diagram illustrating an Internet Protocol address look-up device using a ternary content addressable memory (CAM)

While the present invention will be described more fully hereinafter with reference to the accompanying drawings, in which preferred embodiments of the present invention are shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Illustrative embodiments of the invention are described below. In the interest of clarity, not all features of an actual implementation are described. In the following description, well-known functions, constructions, and configurations are not described in detail since they could obscure the invention with unnecessary detail. It will be appreciated that, in the development of any actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill having the benefit of this disclosure.

Three important factors that must be considered upon designing a next-generation router to provide Internet service of high quality include link speed, switching speed and packet throughput. Among these factors, in relation to link speed and switching speed, since it is possible to transmit router input and output at a speed of several gigabytes to several tens of gigabytes due to development of an optical technology, substantially satisfactory values can be obtained. However, in relation to packet throughput, problems are caused.

Specifically, in the case of looking up an Internet Protocol address in a router, due to a characteristic of an Internet Protocol address system, a problem is caused in connection with LPM (longest prefix matching). The look-up of an Internet Protocol address means that, with the aim of forwarding an Internet Protocol packet, after looking at a destination address included in a header of the Internet Protocol packet, a routing table is searched for entry of a matching address to determine a next-hop. An Internet Protocol address is expressed by a prefix of unspecified length, and a routing search result of the look-up corresponds to an output link directed toward a final destination of the Internet Protocol packet, that is, a next metric. The routing search is executed based on a longest prefix matching (LPM) method in which a prefix having a longest length selects a matching entry on the routing table. A problem in connection with the LPM has been caused since an Internet Protocol address assigning scheme, called a classless inter-domain routing (CIDR) technique, has been widely adopted as one of the measures capable of solving difficulties induced by depletion of Internet Protocol address due to a geometrical progression of Internet users, that is, a rapid increase in a size of an Internet routing table throughout the world.

The classless inter-domain routing (CIDR) technique was officially documented in 1993 as Request for Comments (RFC) 1517, Request for Comments (RFC) 1518, Request for Comments (RFC) 1519, and Request for Comments (RFC) 1520 to eliminate concepts of networks belonging to the traditional class A, class B and class C in Internet Protocol addresses. The classless inter-domain routing (CIDR) technique solves difficulties induced by lack of address space in the class C and squandering of address space in the classes A and B which are caused due to assignment of Internet Protocol addresses by class in the conventional art, whereby it is possible to efficiently manage the Internet Protocol address assigning scheme. Nevertheless, entries of the routing table which must be held by the router are increased in their number, as a result of which Internet Protocol address look-up speed is slowed.

Internet Protocol look-up technologies to develop a very high speed router can be roughly divided into a first category based on hardware using a CAM (content addressable memory), caching and a large-memory structure, and a second category based on software such as an LC (level compressed) trie, hashing and a multibit trie. Realization of the Internet Protocol address look-up by software provides advantages in that it is more flexible and can be easily applied through correction of a protocol. Internet Protocol address look-up by hardware is implemented when high-speed packet processing capability that cannot be obtained by the software is required. In this consideration, nowadays, most high-speed routers of main router vendors use hardware to execute Internet Protocol address look-up.

The content addressable memory (CAM) used to realize an Internet Protocol address look-up function through hardware implements a precise match search task in one clock cycle. The CAM compares, in parallel, an inputted search key with all entries within it, that is, all elements stored in segments physically split within it. As a result of the comparison, the CAM outputs an address of a physical segment in which an element matching the search key is stored. At this time, if there are any data related to the matching element, the data are also outputted. In this way, as the CAM compares, in parallel, the search key with all entries within it and outputs the comparison result, quick search is enabled, and generally, a very short latency time within 10~20 nanoseconds (ns) is required.

Meanwhile, a ternary content addressable memory (CAM) is regarded as a more flexible type of CAM capable of comparing an inputted search key with stored elements having various lengths. In this ternary CAM, since there is a mask bit string accompanying a content bit string, it is not necessary to compare all content bit strings with the search key. Also, the ternary CAM generally supports a search speed that is several times the rate required for optical carrier level 192 (OC-192) or 10 gigabit Ethernet, and up to 129K routes can be dealt with in one chip. The optical carrier level 192 (OC-192) relates to a speed of a fiber optic network conforming to the synchronous optical network (SONET) and which is able to carry about 10 gigabits per second. According to these facts, a ternary CAM can be used to determine LPM (longest prefix matching), and the speed of a ternary CAM is suitable for packet forwarding.

FIG. 1 is a schematic diagram illustrating an Internet Protocol address look-up device using a ternary content addressable memory (CAM). As can be seen from FIG. 1, in the ternary CAM 100, a plurality of routing entries 102 having respective prefixes is stored in physically split segments, respectively. These routing entries 102 are stored in order of prefix length, starting from a physically low address. Prefixes are compared, in parallel, with a search key as a destination address fetched from a header of an Internet Protocol packet to undergo a forwarding process. By this comparison, a routing entry having a prefix matching to the search key is searched for.

As a result of the search, the ternary content addressable memory (CAM) 100 sets a match line of the routing entry having the prefix matching to the search key, to "1". Here, "1" means a logic "1", and this applies to the following description. In the same manner, in the following description, "0" means a logic "0". A priority encoder 104 is connected to match lines of the routing entries 102 of the ternary CAM 100. If there exist routing entries matching the search key, that is, if at least one routing entry corresponding to a set match line exists, the priority encoder 104 searches and outputs a lowermost address among the matching routing entries, that is, a physical address of a longest prefix matching (LPM) entry having a longest prefix length. The physical address of the LPM entry outputted from the priority encoder 104 as described above is applied to a memory (not shown) storing next metrics. Due to the fact that a next metric stored in the address is outputted from the memory, Internet Protocol address look-up for one Internet Protocol packet is completed.

In the Internet Protocol address look-up pattern as described above and shown in FIG. 1, since the prefixes are stored in order of length, the prefix lowermost among the match lines set by the search result is automatically selected as the longest prefix matching (LPM). However, the most serious disadvantage of the pattern using the ternary content addressable memory (CAM) as shown in FIG. 1 is that the prefixes should be stored in order of length. In this regard, in the case where a new prefix must be added when the routing table is updated, in order to keep the order of length in the ternary CAM 100, all of the prefixes having lengths shorter than the new prefix have to be moved to and stored again in higher addresses. This process of updating the routing table by rearranging the prefixes requires a lengthy period of time when compared to the Internet Protocol address look-up. Also, because the routing table must be maintained in an off-line state during the rearrangement, the Internet Protocol address look-up cannot be executed.

A solution to the disadvantage caused by update of the routing table is to preserve unused storage spaces between sets of prefixes having lengths i and i+1. That is to say, the routing entries are divided by length of the prefix, and vacant storage spaces remain in each prefix set to ease addition of new routing entries. Nevertheless, these vacant storage spaces cause a waist of storage space in the ternary content addressable memory (CAM). Furthermore, if all vacant storage spaces are filled up, routing entries have to be rearranged, and because the routing table must be maintained in an off-line state during this further rearrangement, the Internet Protocol address look-up cannot be executed. Recently, as a mobile Internet Protocol is disclosed in the art, it is expected that, due to frequent routing update in the router, Internet Protocol address look-up idle time is increased and Internet Protocol address look-up performance deteriorates markedly.

A vertical logical operation with mask encoded prefix length (VLMP) method suggested by Kobayashi, et al. of NEC Corporation could eliminate the limitation that prefixes have to be stored in order of length. A vertical logical operation with mask encoded prefix length (VLMP) method was described in the article entitled "A Longest Prefix Match Search Engine for Multi-gigabit IP Processing", Kobayashi, M., Murase, T., and Kuriyama, A., in IEEE International Conference on Communications, vol. 3, June 2000, pp. 1360–1364.

Figure 2:
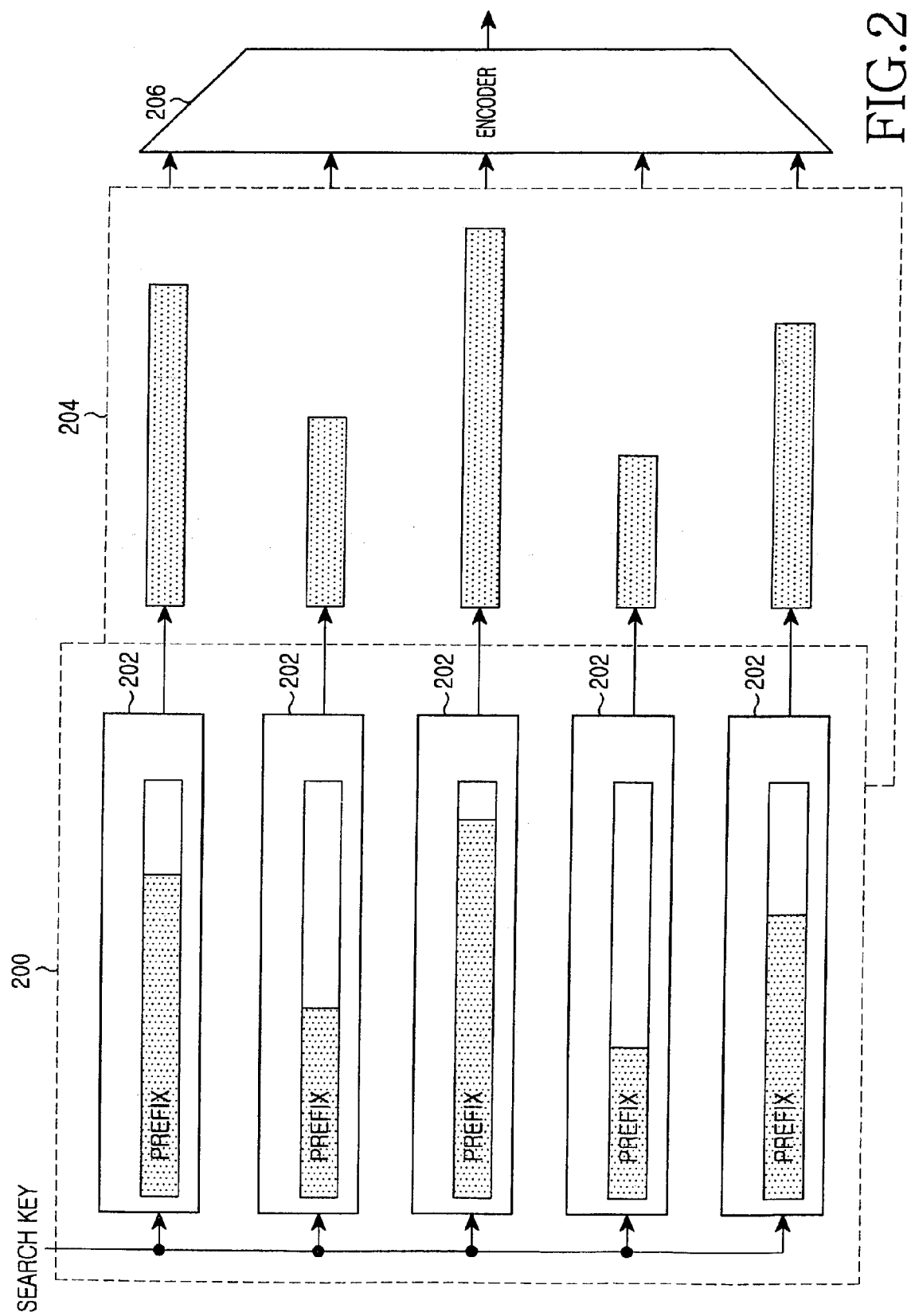
FIG. 2 is a schematic diagram illustrating an Internet Protocol address look-up device adopting a vertical logical operation with mask encoded prefix length (VLMP) method.
Figure 3:
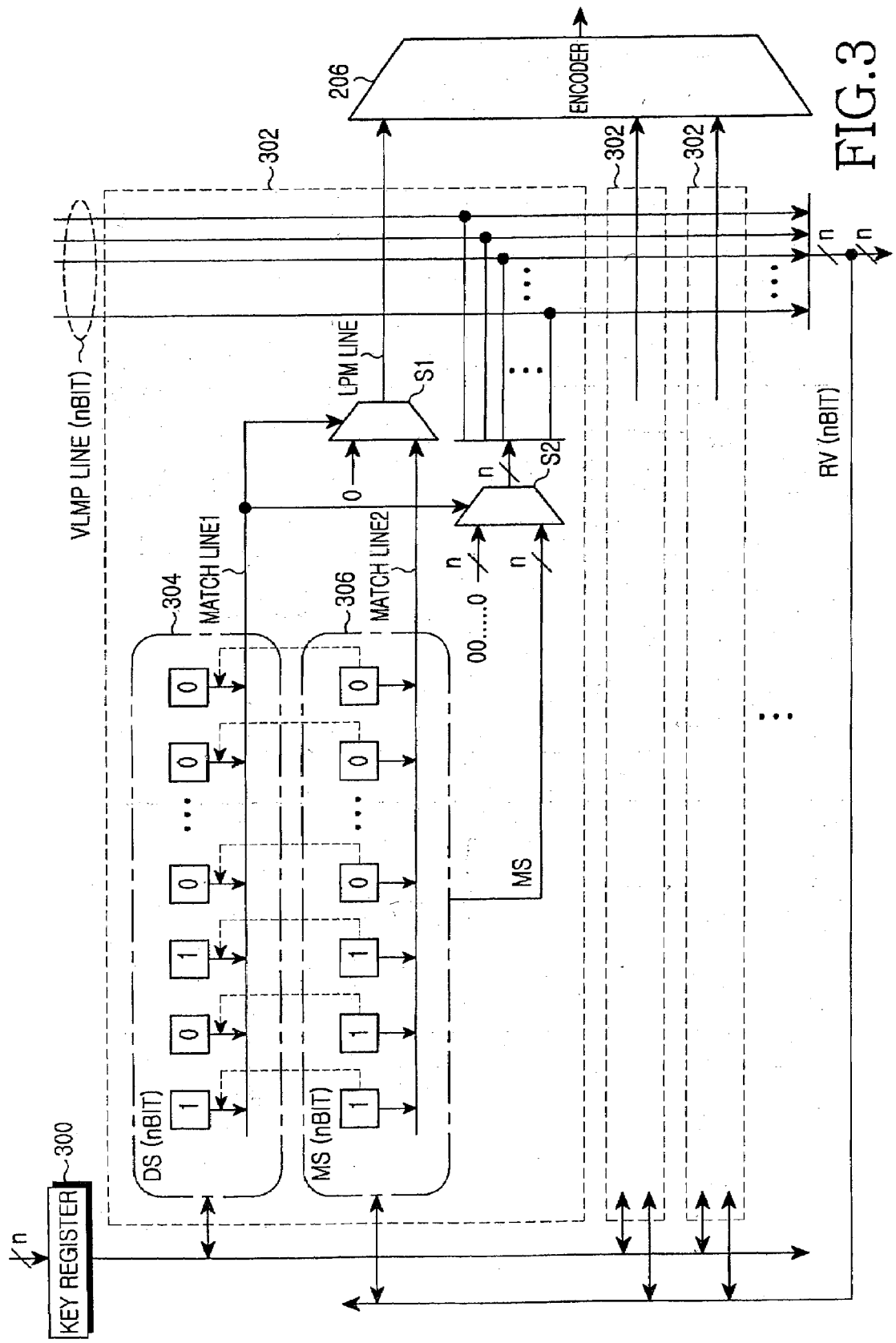
FIG. 3 is a block diagram illustrating the Internet Protocol address look-up device adopting the vertical logical operation with mask encoded prefix length (VLMP) method.

FIG. 2 is a schematic diagram illustrating an Internet Protocol address look-up device adopting a vertical logical operation with mask encoded prefix length (VLMP) method. FIG. 3 is a block diagram illustrating the Internet Protocol address look-up device adopting the vertical logical operation with mask encoded prefix length (VLMP) method.

In order to facilitate understanding of the relevant concepts here, FIG. 1 includes some features related to FIG. 1(*a*) of the above-referenced IEEE article by Kobayashi et al. Also, FIGS. 2 and 3 include some features related to FIGS. 1(*b*) and 5, respectively, of the above-referenced IEEE article by Kobayashi et al.

Internet Protocol address look-up adopting the vertical logical operation with mask encoded prefix length (VLMP) method will be described with reference to the above article. First, as can be readily seen from FIG. 2, in a ternary content addressable memory (CAM) 200, while a plurality of routing entries 202 having respective prefixes are stored in physically split segments, respectively, in contrast to FIG. 1, the routing entries 202 are stored not following the order of prefix length. The ternary CAM 200 searches for a matching prefix by parallel comparison between a search key and the prefixes of the routing entries 202, and outputs prefix length information of the matching routing entry. If there exists at least one matching routing entry, in the same manner as described above, a longest prefix matching (LPM) must be chosen among matching routing entries. To this end, as in FIG. 3 which will be described later, in a VLMP circuit 204 where, after logically operated, an output of the ternary CAM 200 is fed back to the ternary CAM 200 to execute a secondary search, among the matching routing entries searched for in the ternary CAM 200, a longest prefix matching (LPM) entry satisfying the LPM is determined using length information of the matching prefixes. A physical address of the LPM entry determined in this way is outputted by the encoder 206.

Referring now to FIG. 3, a plurality of routing entries 302 are connected to an output of a key register 300 which temporarily stores a search key, and the encoder 206 is connected to outputs of the routing entries 302. Each routing entry 302 has a pair of bit strings of the same length, that is, a data string DS of n bits and a mask string MS. The data string DS includes, starting from a most significant bit (MSB), prefixes of Internet Protocol addresses matching the respective routing entries, and remaining bits mean data bit strings which are filled with "0". The mask string MS serves as a mask bit string representing a prefix length of an Internet Protocol address. Respective mask bits are filled, starting from the most significant bit, with continuous bit strings of "1" which are the same as prefix lengths, and remaining bits are filled with "0". For example, to represent a prefix "110", a data string becomes "11000000" and a mask string becomes "11100000".

In FIG. 3, the longest prefix matching (LPM) search for the search key stored in the key register 300 is executed through two stages as described below.

First Stage 1-1. A search key K stored in the key register 300 is connected to the entries 302.

1-2. In each entry block 304, mask comparison, R1:=(K & MS) XNOR (DS & MS), is conducted. Here, "&" means a bitwise AND operation, and "XNOR" means a bitwise exclusive NOR operation.

1-3. All bits of R1 are AND-operated in each entry block 304, and the result is provided as a match line 1.

1-4. If the match line 1 is set to "1", a selector S2 outputs a mask string MS to a vertical logical operation with mask encoded prefix length (VLMP) line. Otherwise, the selector S2 outputs "00 . . . 0" having the same length as the mask string MS, to the VLMP line.

1-5. A vertical bitwise OR operation, that is, the VLMP is implemented at each bit position of the VLMP line. The result is represented as RV in FIG. 3.

Second Stage 2-1. An RV is connected to routing entries 302.

2-2. The two bit strings, that is, the RV and the mask bit string MS are precisely compared with each other in each entry block 306. In other words, R2:=RV NOR MS is conducted.

2-3. All bits of R2 are AND-operated in each entry block 306, and the result is provided to a match line 2.

2-4. If both of a match line 1 and a match line 2 of a certain entry are "1", a selector S1 outputs "1" to the longest prefix matching (LPM) line. Otherwise, the selector S1 outputs "0" to the LPM line.

Only the longest prefix matching (LPM) line of a routing entry determined as an LPM entry among the routing entries 302 through the above-described two stages is set to "1". According to this, the encoder 206, which is connected to LPM lines of the routing entries, searches for and outputs a physical address of a routing entry matching a longest prefix matching (LPM) line that is set to "1".

For example, assuming that a search key is inputted as "11011111" in a state wherein four prefixes, P1="110", P2="1001", P3="11011" and P4="1101", are sequentially stored in first through fourth routing entries, respectively, among the routing entries 302, as the search key is compared in parallel with the prefixes, the first, third and fourth routing entries match. Then, a vertical logical operation with mask encoded prefix length (VLMP) is implemented for mask strings corresponding to the first, third and fourth routing entries. In the above example, mask strings, P1_mask="11100000", P3_mask="11111000" and P4_mask="11110000", and the VLMP result is "11111000". This VLMP result is the same irrespective of storing sequence of mask strings. Therefore, it is not necessary for the prefixes to be arranged in order of length. Once the VLMP result is obtained, it is to be readily understood that the longest prefix matching (LPM) occurred for an entry including a mask string that perfectly matches the VLMP result. Thereafter, by secondarily comparing the VLMP result, "11111000", with the P1_mask, P3_mask and P4_mask, as the third entry matches the VLMP result, it is to be understood that the third entry becomes the LPM entry.

According to the Internet Protocol address look-up adopting the vertical logical operation with mask encoded prefix length (VLMP) method as described above, it is possible to find a longest prefix matching (LPM) entry even though prefixes are not arranged in order of length. Thus, when a routing table is updated, since it is not necessary to rearrange the prefixes even in the case that a new prefix must be added, update can be quickly implemented. Nevertheless, because the vertical logical operation with mask encoded prefix length (VLMP) is added and the is VLMP result should be fed back as a search key, additional circuits are required. Hence, the Internet Protocol address look-up device adopting the VLMP method is manufactured as a dedicated LSI (large scale integration) including the additional circuits.

As a result, the above-referenced Internet Protocol address look-up methods suffer from defects in that the prefixes of the routing table must be arranged in order of length, or, even when it is not necessary to arrange the prefixes in order of length, circuits for feedback search must be added to the ternary content addressable memory (CAM).

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention less clear.

Figure 4:
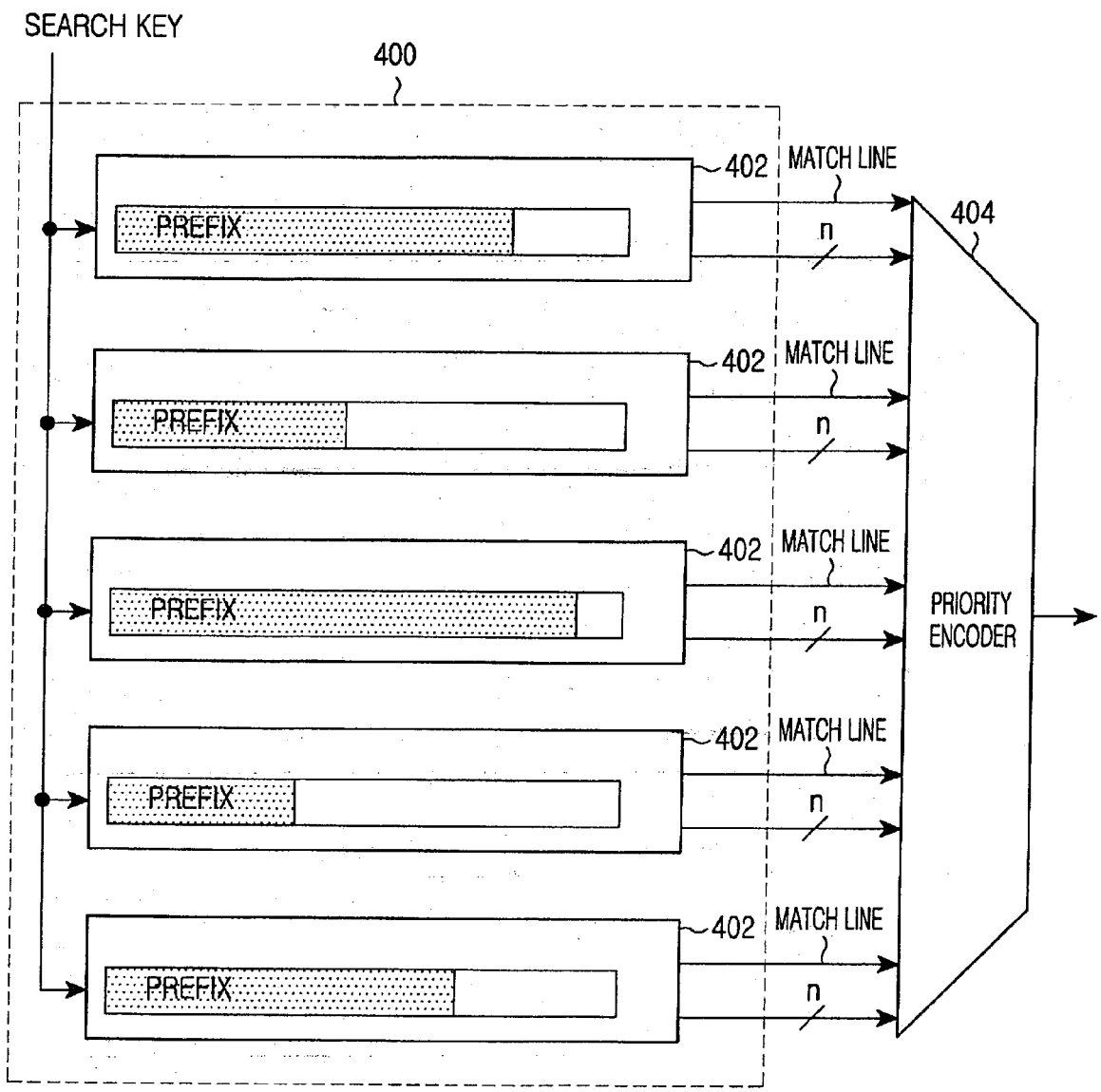
FIG. 4 is a schematic diagram illustrating an Internet Protocol address look-up device using a ternary content addressable memory (CAM), in accordance with the principles of the present invention.

FIG. 4 is a schematic diagram illustrating an Internet Protocol address look-up device using a ternary content addressable memory (CAM), in accordance with the principles of the present invention. The Internet Protocol address look-up device according to the present invention includes a ternary CAM 400, and a priority encoder 404 connected to an output of the ternary CAM 400. As can be readily seen from FIG. 4, in the ternary CAM 400, routing entries 402 having respective prefixes are stored in physical segments, respectively, without regard to order of prefix length. The ternary CAM 400 functions to compare, in parallel, a search key with the prefixes of the routing entries to search a matching prefix, set a match line of a matching routing entry, and output a mask string of the matching routing entry to the priority encoder 404.

Then, in the case where at least one match line is set in the ternary CAM 400, that is, in the case where at least one among match lines of the routing entries 402 is set, the priority encoder 404 compares prefix lengths of mask strings outputted in correspondence to set match lines, determines, as a longest prefix matching (LPM) entry, a routing entry corresponding to a longest mask string, and outputs a physical address of the LPM entry on the basis of a match line of the LPM entry.

Figure 5:
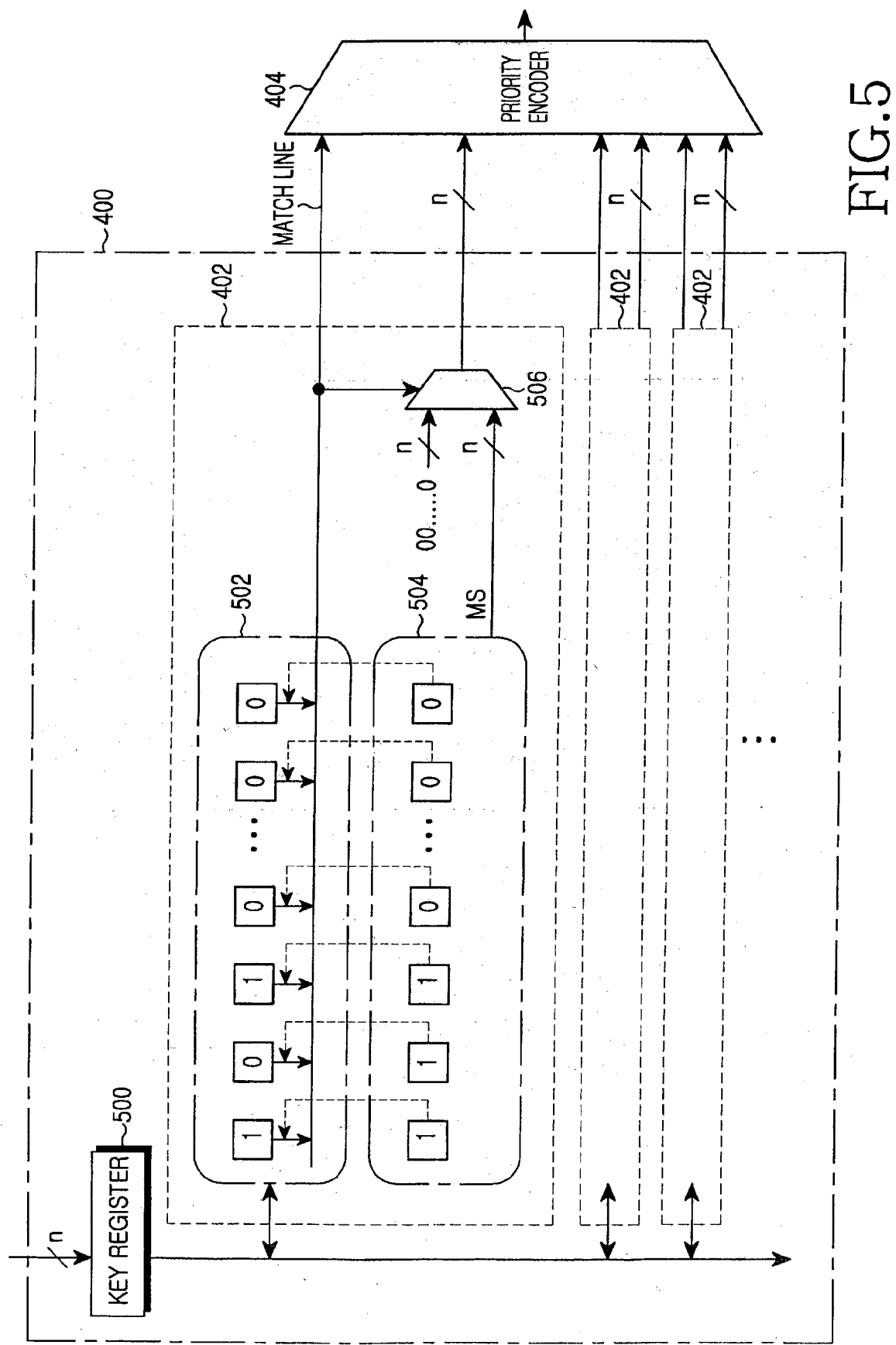
FIG. 5 is a block diagram illustrating the Internet Protocol address look-up device using the ternary content addressable memory (CAM), in accordance with the principles of the present invention.

FIG. 5 is a block diagram illustrating the Internet Protocol address look-up device using the ternary content addressable memory (CAM), in accordance with the principles of the present invention. Referring to FIG. 5, in the ternary content addressable memory (CAM) 400, the plurality of routing entries 402 are connected to an output of a key register 500 for temporarily storing a search key, and the priority encoder 404 is connected to outputs of the routing entries 402 of the ternary CAM 400. In the same manner as the routing entry 302 aforementioned with reference to FIG. 3, each routing entry 402 has a pair of bit strings of the same length, that is, a data string DS of n bits and a mask string MS.

The search key of the key register 500 is connected to the routing entries 402, and, in the same manner as the block 304 of FIG. 3, in a block 502 of each entry, R1:=(K & MS) XNOR (DS & MS) is conducted. Then, all bits of R1 are AND-operated in each entry block 502, and the result is provided as a match line. A selector 506 functions to select, depending upon whether or not a match line is set in each entry, a mask string MS or "00 . . . 0" continued with the same length as the mask string MS, and output the selected mask string MS or "00 . . . 0" to the priority encoder 404. If the match line is set to "1", the selector 506 outputs the mask string MS. Otherwise, the selector 506 outputs "00 . . . 0".

As described above, if at least one match line is set in the ternary content addressable memory (CAM) 400, the priority encoder 404 compares prefix lengths of mask strings outputted from the ternary CAM 400 in correspondence to set match lines, and determines, as a longest prefix matching (LPM) entry, a routing entry corresponding to a longest mask string. Thereupon, in the same manner as in FIG. 1, the priority encoder 404 outputs a physical address of the LPM entry determined in this way, on the basis of a match line of the LPM entry. At this point, the priority encoder 404 compares and searches for the prefix lengths of the mask strings to determine a longest prefix matching (LPM) entry, starting from an MSB (most significant bit). The reason why the MSB is first compared is that, as described above, the mask strings are filled, starting from the MSB, with continuous bit strings of "1" having the same length as the prefix, and remaining strings are filled with "0".

Figure 6:
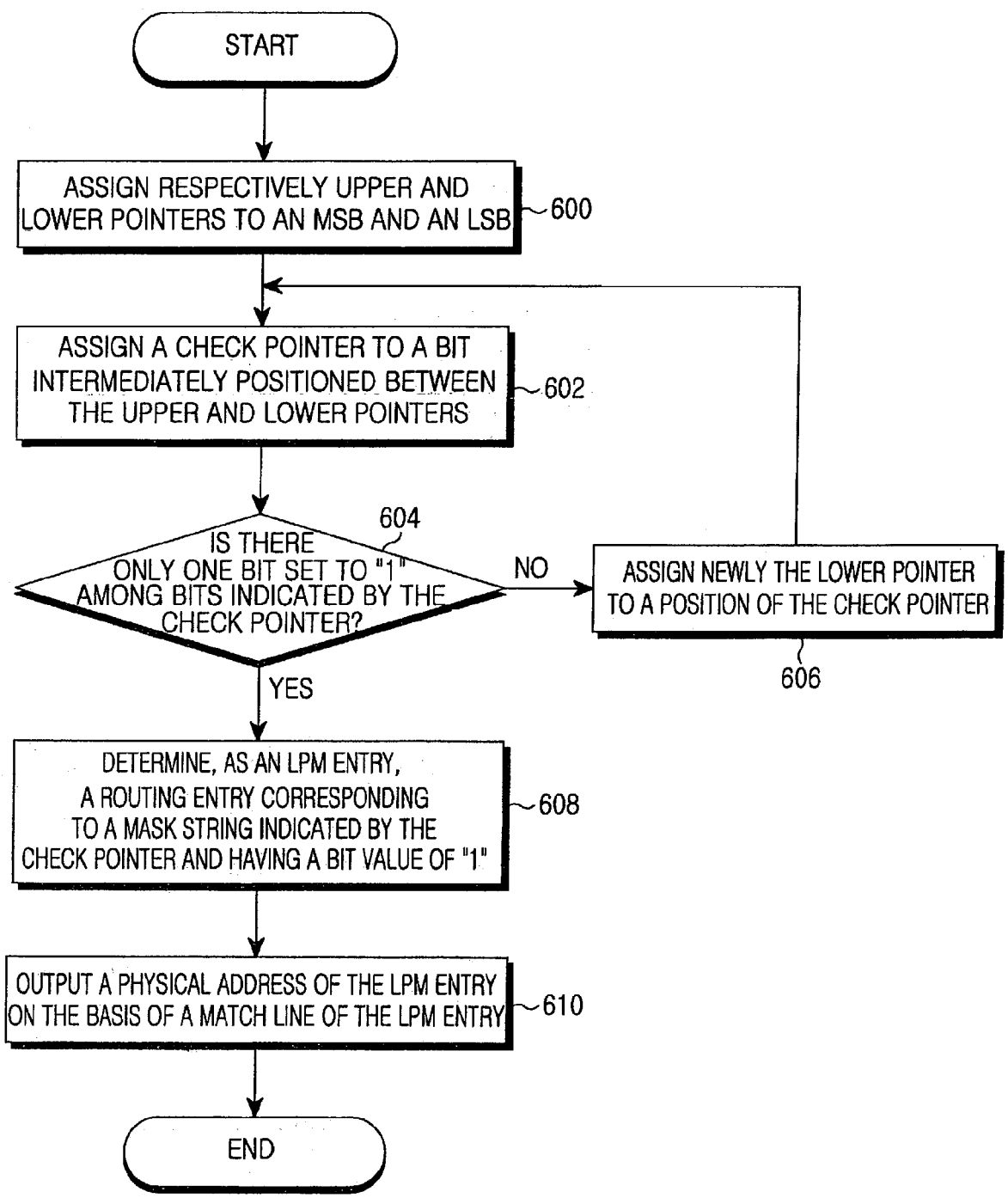
FIG. 6 is a flowchart illustrating operations of a priority encoder, in accordance with the principles of the present invention.

FIG. 6 is a flowchart illustrating operations of a priority encoder, in accordance with the principles of the present invention. FIGS. 7A through 7D are views illustrating longest prefix matching (LPM) searching operations of the priority encoder, in accordance with the principles of the present invention. As shown in FIGS. 7A through 7D, the shaded bits are parts of the data of the prefix and are known as prefix bits, while the non-shaded bits are not part of the data of the prefix.

Figure 7A:
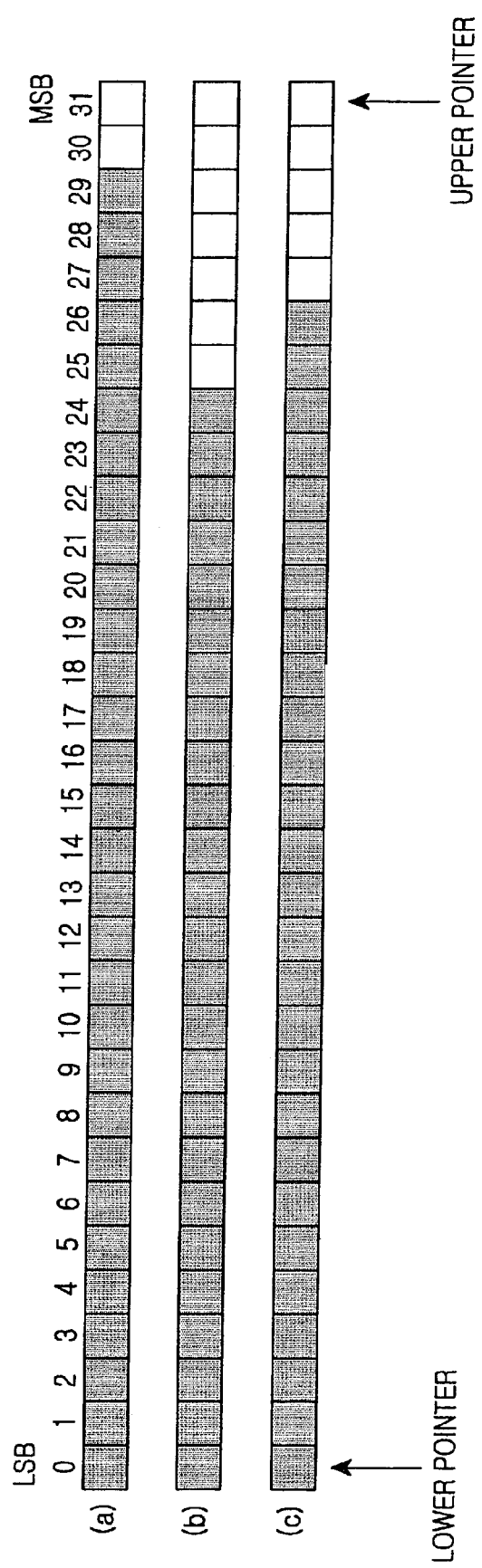
FIGS. 7A through 7D are views illustrating longest prefix matching (LPM) searching operations of the priority encoder, in accordance with the principles of the present invention.
Figure 7B:
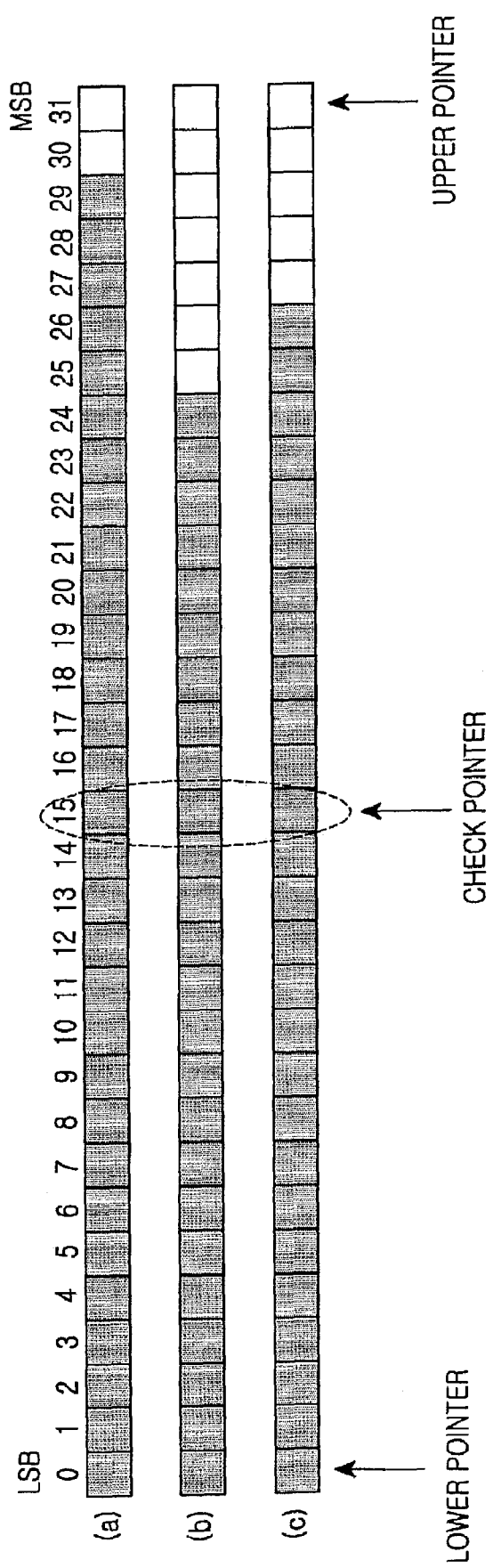

A procedure in which the priority encoder 404 compares lengths of the mask strings, determines the longest prefix matching (LPM) entry and outputs the physical address of the LPM entry is shown by steps S600 through S610 in FIG. 6. Referring to FIGS. 7A through 7D, the longest prefix matching (LPM) searching operations of the priority encoder 404 are illustrated, presuming that there are three mask strings, for the purpose of comparison. If at least one match line is set in the ternary content addressable memory (CAM) 400, at step S600, the priority encoder 404 assigns upper and lower pointers to the most significant bit (MSB) and the least significant bit (LSB), respectively, as shown in FIG. 7A, among mask strings outputted in correspondence to set match lines. Then, at step S602, the priority encoder 404 assigns a check pointer to an intermediate position between the upper and lower pointers, as shown in FIG. 7B. As shown in FIG. 7B, the check pointer indicates three prefix bits at position 15.

Figure 7C:
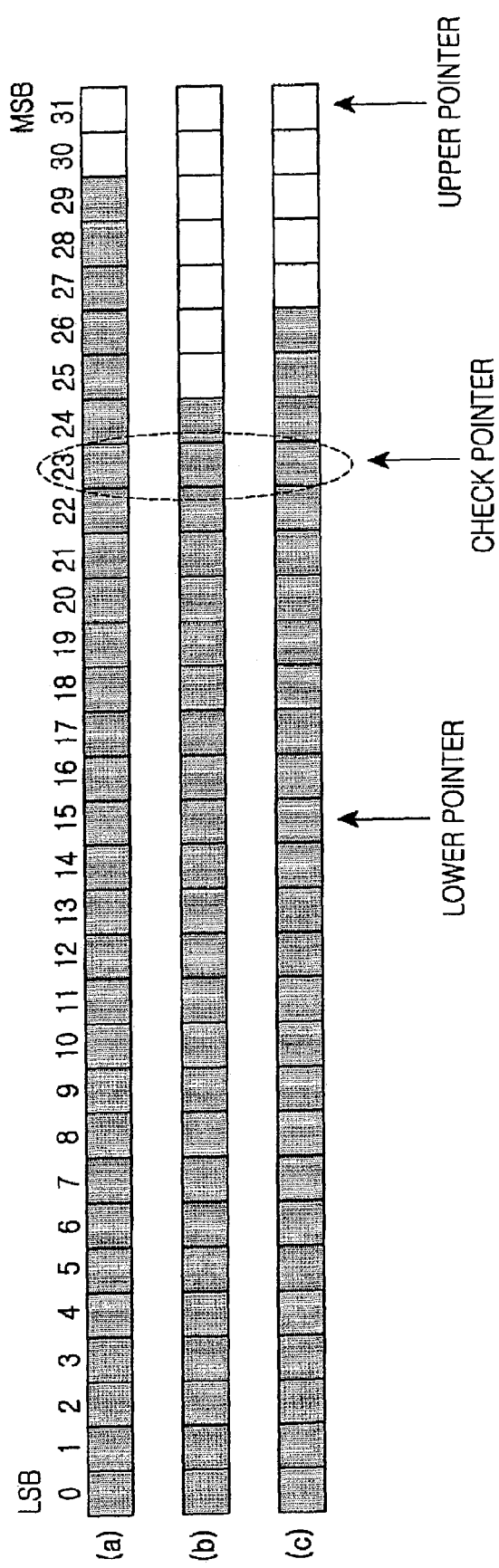

Thereupon, at step S604, it is determined whether or not there is only one bit set to "1", suggesting that, among the mask strings, a bit value indicated by the check pointer is a bit representing a prefix. If there exist two or more bits set to "1", at step S606, the lower pointer is newly assigned to a position of the check pointer, as shown in FIG. 7C, and the program returns to step S602. As shown in FIG. 7C, the check pointer indicates three prefix bits at position 23.

Figure 7D:
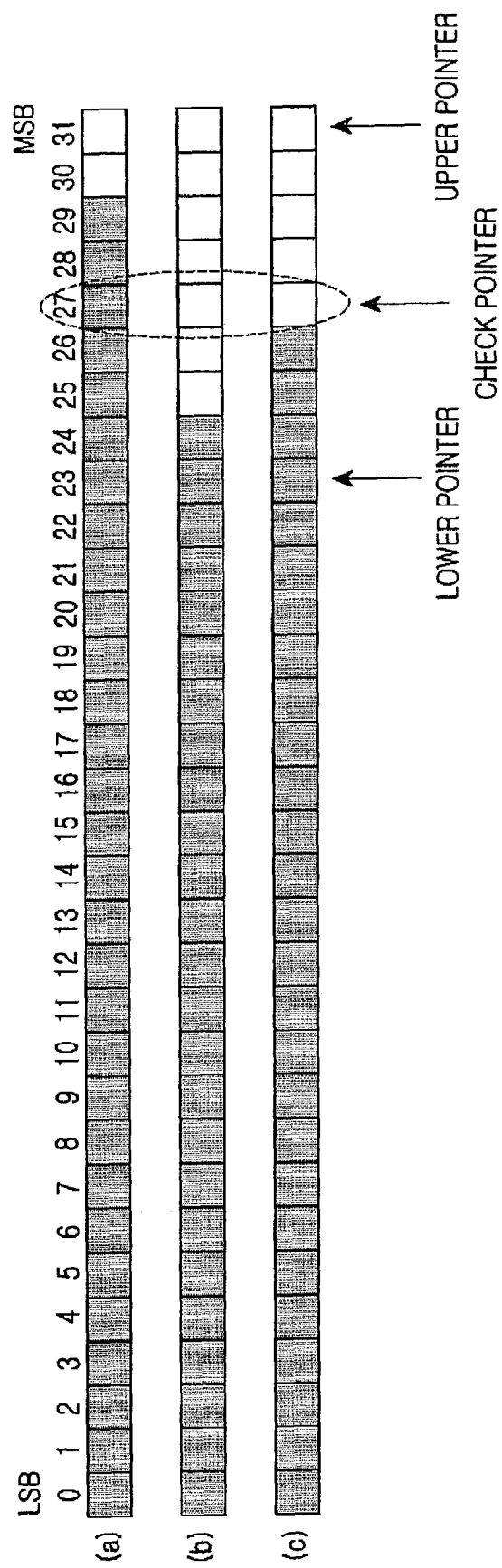

After passing through steps S602 and S604, if there still exist two or more bits set to "1", at step S606, the lower pointer is further newly assigned to a position of the check pointer, as shown in FIG. 7D, and the program returns to step S602. After doing this, if there exists one bit set to "1" as shown in FIG. 7D, at step S608, a routing entry corresponding to a mask string indicated by the check pointer at that time and having a bit value of "1" is determined as a longest prefix matching (LPM) entry. Thereafter, at step S610, a physical address of the LPM entry determined in this way is outputted on the basis of a match line of the LPM entry, in the same manner as in FIG. 1. As shown in FIG. 7D, the check pointer indicates one prefix bit at position 27.

Accordingly, in the present invention, while, as in the aforementioned vertical logical operation with mask encoded prefix length (VLMP) method, the prefixes are stored in the ternary content addressable memory (CAM) 400 without regard to order of length, it is not necessary to conduct feedback searches. Therefore, not only can a routing table be quickly updated, but also it is possible to look up an Internet Protocol address using an ordinary ternary CAM rather than a dedicated LSI (large scale integration), only by changing a priority encoder.

Figure 8:
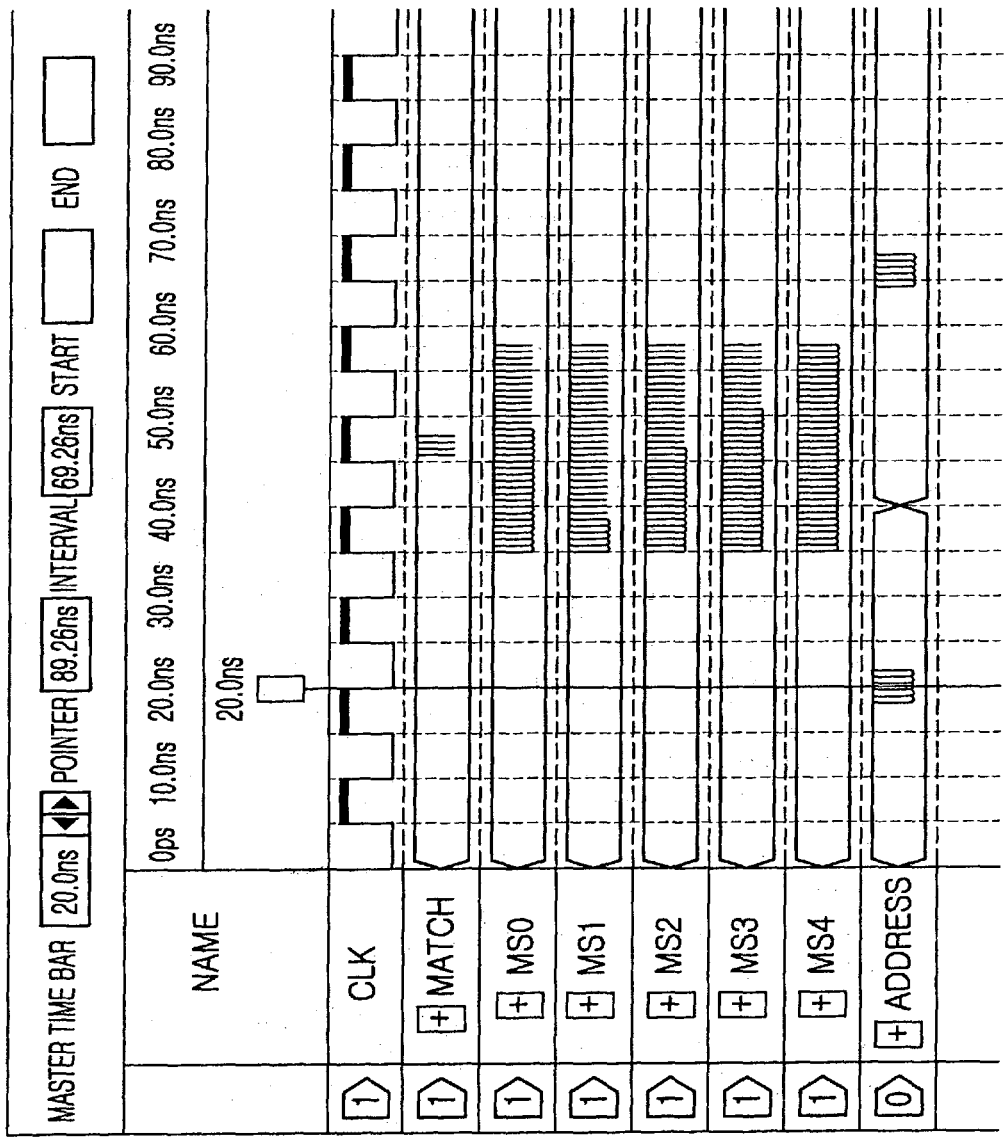
FIG. 8 is a view illustrating a simulation result of the Internet Protocol address look-up device using the ternary content addressable memory (CAM), in accordance with the principles of the present invention.

FIG. 8 is a view illustrating a simulation result of the Internet Protocol address look-up device using the ternary content addressable memory (CAM), in accordance with the principles of the present invention.

For reference, by framing the priority encoder 404 as described above using VHDL (very high speed hardware description language) codes and performing simulation, as can be readily seen from FIG. 8, it was found that it takes about 40 nanoseconds (ns) to implement the look-up process for one Internet Protocol packet. It is to be understood from FIG. 8 that, when a prefix length is 27 bits, among five mask strings MS0 through MS4, the second mask string MS1 is determined to correspond to a longest prefix matching (LPM) entry, and a physical address ADDRESS of a second routing entry is outputted as "00010".

In addition to the 40 nanoseconds (ns), considering 10 nanoseconds (ns) elapsed while the ternary content addressable memory (CAM) 400 conducts the parallel search until the result is obtained, a total of 50 nanoseconds (ns) is required. Thus, searches can be conducted about twenty-five million times a second. By virtue of this fact, the present invention can be applied to an Internet Protocol backbone router which has input and output at level of 10 gigabits per second (Gbps), which requires router table update about 1000 times a second, and which can support a forwarding speed of 9.6 gigabits per second (Gbps) satisfying optical carrier level 192 (OC-192) per port capable of being used in a terabit router which is currently being developed with the aim of obtaining the highest speed.

Although the preferred embodiments of the present invention have been disclosed for illustrative purposes, those skilled in the art will appreciate that various modifications, additions and substitutions are possible, without departing from the scope and spirit of the invention. In particular, while it was illustratively explained in the embodiment of the present invention that a lower pointer is newly assigned to a position of a check pointer and lengths of mask strings are compared to search a longest prefix matching (LPM) entry, a person skilled in the art will readily recognize that the lengths of the mask strings can be compared in different ways to search the LPM entry.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An Internet Protocol address look-up method, the method comprising the steps of:
    inputting a search key into a plurality of routing entries, each respective one of the routing entries having a data string that includes data of a respective prefix and having a mask string that includes a length of the respective prefix, each respective one of the routing entries being included in a ternary content addressable memory (CAM);
    detecting matching prefixes when a search key matches prefixes from among the prefixes of the routing entries;
    outputting the mask strings corresponding to the routing entries having the matching prefixes; and
    comparing lengths of the matching prefixes corresponding to the outputted mask strings to determine a longest prefix matching (LPM) entry, the longest prefix matching entry corresponding to the routing entry having the longest outputted mask string;
    said method further comprising the steps, after the outputting step, of:
    assigning an upper pointer to a most significant bit of the outputted mask strings;
    assigning a lower pointer to a least significant bit of the outputted mask strings;
    assigning a check pointer, intermediately positioned between the upper and lower pointers, to a bit of the outputted mask strings; and
    when more than one bit indicated by the check pointer corresponds to a prefix bit, reassigning the lower pointer to a new position corresponding to a position of the check pointer, and then reassigning the check pointer to a bit of the outputted mask strings intermediately positioned between the upper pointer and the reassigned lower pointer.

2. The method of claim 1, said detecting being performed in parallel for all of the routing entries.

3. The method of claim 1, further comprising:
    after said inputting step, setting match lines corresponding to the routing entries having the matching prefixes;
    said comparing step including comparing the lengths of the matching prefixes of the routing entries corresponding to the set match lines.

4. The method of claim 1, the data string and mask string of each one of the routing entries having n bits.

5. The method of claim 1, said outputting step comprising outputting the mask strings from the ternary content addressable memory to a priority encoder.

6. The method of claim 1, the search key comprising a destination address of an Internet Protocol packet to be forwarded.

7. The method of claim 6, said detecting step being performed in parallel for all of the routing entries.

8. The method of claim 7, further comprising:
after said inputting step, setting match lines corresponding to the routing entries having the matching prefixes;
said comparing step including comparing the lengths of the matching prefixes of the routing entries corresponding to the set match lines.

9. The method of claim 8, the data string and mask string of each one of the routing entries having n bits.

10. The method of claim 9, said outputting step comprising outputting the mask strings from the ternary content addressable memory to a priority encoder.

11. An Internet Protocol address look-up method for looking up an Internet Protocol address of an Internet Protocol packet in order to forward the Internet Protocol packet, the method comprising the steps of:
inputting a search key into a plurality of routing entries, the search key corresponding to a destination address of an Internet Protocol packet to be forwarded, each respective one of the routing entries having a data string that includes a respective prefix and having a mask string that represents a length of the respective prefix, each respective one of the routing entries being included in a ternary content addressable memory (CAM);
detecting matching prefixes when a search key matches prefixes from among the prefixes of the routing entries;
outputting the mask strings corresponding to the routing entries having the matching prefixes;
assigning an upper pointer to a most significant bit of the outputted mask strings;
assigning a lower pointer to a least significant bit of the outputted mask strings;
assigning a check pointer, intermediately positioned between the upper and lower pointers, to a bit of the outputted mask strings;
when more than one bit indicated by the check pointer corresponds to a prefix bit, reassigning the lower pointer to a new position corresponding to a position of the check pointer, and then reassigning the check pointer to a bit of the outputted mask strings intermediately positioned between the upper pointer and the reassigned lower pointer; and
when only one bit indicated by the check pointer corresponds to a prefix bit, determining that a longest prefix matching (LPM) entry corresponds to the outputted mask string having one bit indicated by the check pointer, the longest prefix matching entry corresponding to the routing entry having the longest outputted mask string.

12. The method of claim 11, further comprising:
after said inputting step, setting match lines of the routing entries having the matching prefixes;
said step of assigning the upper pointer comprising assigning the upper pointer to the most significant bit of outputted mask strings that correspond to the routing entries having the set match lines;
said step of assigning the lower pointer comprising assigning the lower pointer to the least significant bit of the outputted mask strings that correspond to the routing entries having the set match lines; and
said step of assigning the check pointer comprising assigning the check pointer to the intermediately positioned bit of the outputted mask strings that correspond to the routing entries having the set match lines.

13. The method of claim 11, the data strings and mask strings each having n bits.

14. The method of claim 11, said outputting step comprising outputting the mask strings from the ternary content addressable memory to a priority encoder.

15. The method of claim 11, said detecting step being performed in parallel for all of the routing entries.

16. The method of claim 15, further comprising:
after said inputting step, setting match lines of the routing entries having the matching prefixes;
said step of assigning the upper pointer comprising assigning the upper pointer to the most significant bit of outputted mask strings that correspond to the routing entries having the set match lines;
said step of assigning the lower pointer comprising assigning the lower pointer to the least significant bit of the outputted mask strings that correspond to the routing entries having the set match lines; and
said step of assigning the check pointer comprising assigning the check pointer to the intermediately positioned bit of the outputted mask strings that correspond to the routing entries having the set match lines.

17. The method of claim 16, the data strings and mask strings each having n bits.

18. The method of claim 17, said outputting step comprising outputting the mask strings from the ternary content addressable memory to a priority encoder, said assigning of the upper, lower, and check pointers being performed by the priority encoder.

19. An Internet Protocol address look-up method, the method comprising the steps of:
inputting a search key into a plurality of routing entries, each respective one of the routing entries having a data string that includes data of a respective prefix and having a mask string that includes a length of the respective prefix, each respective one of the routing entries being included in a ternary content addressable memory (CAM);
detecting matching prefixes when a search key matches prefixes from among the prefixes of the routing entries;
outputting the mask strings corresponding to the routing entries having the matching prefixes; and
comparing lengths of the matching prefixes corresponding to the outputted mask strings to determine a longest prefix matching (LPM) entry, the longest prefix matching entry corresponding to the routing entry having the longest outputted mask string;
said method further comprising the steps, after the outputting step, of:
assigning an upper pointer to a most significant bit of the outputted mask strings;
assigning a lower pointer to a least significant bit of the outputted mask strings;
assigning a check pointer, intermediately positioned between the upper and lower pointers, to a bit of the outputted mask strings; and
when only one bit indicated by the check pointer corresponds to a prefix bit, determining that a longest prefix matching (LPM) entry corresponds to the outputted mask string having one bit indicated by the check pointer, the longest prefix matching entry corresponding to the routing entry having the longest outputted mask string.

20. The method of claim 1, further comprising:
after said inputting step, setting match lines of the routing entries having the matching prefixes;

said step of assigning the upper pointer comprising assigning the upper pointer to the most significant bit of outputted mask strings that correspond to the routing entries having the set match lines;

said step of assigning the lower pointer comprising assigning the lower pointer to the least significant bit of the outputted mask strings that correspond to the routing entries having the set match lines; and said step of assigning the check pointer comprising assigning the check pointer to the intermediately positioned bit of the outputted mask strings that correspond to the routing entries having the set match lines.

21. The method of claim 19, further comprising:

after said inputting step, setting match lines of the routing entries having the matching prefixes;

said step of assigning the upper pointer comprising assigning the upper pointer to the most significant bit of outputted mask strings that correspond to the routing entries having the set match lines;

said step of assigning the lower pointer comprising assigning the lower pointer to the least significant bit of the outputted mask strings that correspond to the routing entries having the set match lines; and said step of assigning the check pointer comprising assigning the check pointer to the intermediately positioned bit of the outputted mask strings that correspond to the routing entries having the set match lines.

* * * * *